United States Patent [19]
Palmour

[11] Patent Number: 5,264,713
[45] Date of Patent: Nov. 23, 1993

[54] JUNCTION FIELD-EFFECT TRANSISTOR FORMED IN SILICON CARBIDE

[75] Inventor: John W. Palmour, Cary, N.C.

[73] Assignee: Cree Research, Inc., Durham, N.C.

[21] Appl. No.: 715,400

[22] Filed: Jun. 14, 1991

[51] Int. Cl.$^5$ .................. H01L 29/80; H01L 27/01; H01L 27/12; H01L 21/20

[52] U.S. Cl. .................... 257/77; 257/267; 257/76; 437/100

[58] Field of Search .............. 357/22 I, 22 K, 22 C, 357/22 D, 23.2, 56, 61; 257/76, 77, 267; 437/100

[56] References Cited

U.S. PATENT DOCUMENTS

| | | | |
|---|---|---|---|
| 4,611,222 | 9/1986 | Page | 357/56 |
| 4,762,806 | 8/1988 | Suzuki et al. | |
| 4,849,797 | 7/1989 | Ukai et al. | 357/61 |
| 4,875,083 | 10/1989 | Palmour | 357/61 |
| 4,897,710 | 1/1990 | Suzuki et al. | |
| 4,916,510 | 4/1990 | Sano et al. | 357/23.1 |
| 4,945,394 | 7/1990 | Palmour et al. | 357/34 |
| 4,983,536 | 1/1991 | Balat et al. | |
| 4,994,413 | 2/1991 | Eshita | 357/16 |
| 5,061,972 | 10/1991 | Edmond | 357/61 |
| 5,075,746 | 12/1991 | Hayashi et al. | 357/4 |

FOREIGN PATENT DOCUMENTS 63-136568  6/1988  Japan .................. 357/61

OTHER PUBLICATIONS

Kanaya et al, "Controlled Sublimation Growth of Single Crystalling 4H-SiC and 6H-SiC and Identification of Polytypes by X-Ray Diffraction", Appl. Phys. Lett, vol. 58, #1, 7 Jan. 1991, pp. 56–58.

G. Kelner, S. Binari, M. Shur, and J. Palmour; High Temperature Operation of α-Silicon Carbide Buried-Gate Junction Field Effect Transistors; Elec. Lett. vol. 27, No. 12, pp. 1038–1040, Jun.

Galina Kelner et al; High-Transconductance β-SiC Buried-Gate JFET's; IEEE Transactions On Electron Devices, vol. 36, No. 6, Jun. 1989, pp. 1045–1049.

V. A. Dmitriev et al; High-temperature SiC-6H field-effect transistor with p-n gate; Sov. Tech. Phys. Lett. 14(2), Feb. 1988; pp. 127, 128.

Galina Kelner et al; β-SiC MESFET's and Buried-Gate JFET's; IEEE Electron Device Letters, vol. ED-L-8, No. 9, Sep. 1987, pp. 428–430.

*Primary Examiner*—Rolf Hille
*Assistant Examiner*—Mahshid Saadat
*Attorney, Agent, or Firm*—Bell, Seltzer, Park & Gibson

[57] ABSTRACT

A junction field-effect transistor is disclosed that comprises a bulk single crystal silicon carbide substrate having respective first and second surfaces opposite one another, the substrate having a single polytype and having a concentration of suitable dopant atoms so as to make the substrate a first conductivity type. A first epitaxial layer of silicon carbide is formed on the first surface of the substrate, and having a concentration of suitable dopant atoms that give the first epitaxial layer the first conductivity type. A second epitaxial layer of silicon carbide is formed on the first epitaxial layer, the second epitaxial layer having a concentration of suitable dopant atoms to give the second epitaxial layer a second conductivity type opposite from the first conductivity type. A higher conductivity region of silicon carbide is formed on the second epitaxial layer, A trench is formed in the second epitaxial layer and higher conductivity region extending entirely through the higher conductivity region and partially into the second epitaxial layer toward the first surface of the substrate for defining a gate region in the second epitaxial layer between the trench and the first epitaxial layer. The trench divides the second epitaxial layer and higher conductivity region into respective first and second regions with the trench therebetween.

30 Claims, 6 Drawing Sheets

JUNCTION FIELD-EFFECT TRANSISTOR FORMED IN SILICON CARBIDE

This invention was made with Government support under Department of the Navy Contract No. N00014-90-C-0037. The Government has certain rights in this invention.

FIELD OF THE INVENTION

The present invention relates to high temperature junction field-effect transistors (JFETs), and more particularly to such transistors formed in silicon carbide.

BACKGROUND OF THE INVENTION

A number of different transistor structures have been used for high power, high-frequency applications such as the metal-oxide semiconductor field-effect transistor (MOSFET), the metal-semiconductor field-effect transistor (MESFET) and the junction field-effect transistor (JFET). Junction field-effect transistors use the depletion region of a reverse-biased p-n junction to modulate the cross-sectional area of the device available for current flow. JFETs are predominantly majority carrier devices and are therefore advantageous for use in high speed applications because they do not suffer from minority carrier storage effects which would limit the range of frequencies over which these devices could operate.

In addition to the type of structure—and perhaps more fundamentally—the characteristics of the semiconductor material from which a transistor is formed also affects the operating parameters. Of the characteristics which affect a transistor's operating parameters, the electron mobility, saturated electron drift velocity, electric breakdown field and thermal conductivity have the greatest effect on a transistor's operating characteristics. These characteristics are further affected by the crystal polytypes of the semiconductor material used in the construction of the device. Furthermore, the number of defects in the crystalline semiconductor material affects the characteristics of the device as fewer defects generally produce higher quality devices.

Previously, JFETs have been manufactured of silicon (Si) or gallium arsenide (GaAs) because of their ease of manufacture. Although these devices provide increased operating frequencies, the relatively low breakdown voltage and the lower thermal conductivity of these materials limit their usefulness. For high power applications, previous Si or GaAs devices operating in the RF frequencies (up to 1.0 GHz) and in the 1–10 GHz microwave range have had limited power handling capability. Furthermore, previous devices were limited in the temperatures at which they could operate.

Alternatively, silicon carbide (SiC) has been known for many years to have excellent physical and electronic properties which should allow production of electronic devices that can operate at significantly higher temperatures than devices produced from silicon (Si) or GaAs. The most important of these properties are its wide bandgap (about 2.9 eV for 6H-SiC at room temperature), chemical inertness, and low dopant diffusivities. The combination of these properties make SiC well suited to high temperature electrical operation with low leakage currents, and minimal degradation due to diffusion or electromigration. The high electric breakdown field of about $4 \times 10^6$ V/cm, high saturated electron drift velocity of about $2.0 \times 10^7$ cm/sec, and high thermal conductivity of about 4.9 W/cm-K also indicates that SiC is a very promising material for high power, high frequency operation at elevated temperatures. Unfortunately, the low electron mobility and difficulty in manufacturing SiC devices has limited the usefulness of SiC in many of these applications.

Previously, 6H-SiC JFETs have been reported using epitaxially grown p-type 6H-SiC thin films, as thick as 20–30 μm, grown on n-type 6H-SiC substrates (Dmitriev et al, Sov. Tech. Phys. Lett. 14(2) (1988); and Anikin et al, Pis'ma ZH. Tekh. Fiz. 15 (1989)). The use of an n-type substrate, however, results in buried gate layers which must be contacted from the top of the wafer using an etched window through the channel layer. A topside contact takes up a large area, making the die area larger, and it requires photolithography steps for etching the window and for patterning the gate contact. Additionally, spreading resistance loss associated with propagating the gate signal across the low mobility p-type epilayer can be especially detrimental to high frequency devices.

The use of a p-type substrate gate allows one to reduce the die size of the device (no topside gate contact) and depositing the ohmic contact to the backside of the wafer does not require any photolithography. The spreading resistance through the substrate is much less, by virtue of the large cross-sectional area of the die, as compared with the cross-sectional area of a p-type epilayer.

JFETs using p-type substrates have been reported by Kelner, et al, IEEE Trans. on Electron Dev., Vol. 36, No. 6 (1989). Kelner used a p-type 6H-SiC substrate that acted as the buried gate for β-SiC epilayer. β-SiC grown on 6H-SiC can include a high density of crystalline defects, however, known as double positioning boundaries (DPBs). These defects can contribute to high leakage currents in such films as compared with 6H-SiC grown on 6H-SiC.

OBJECT AND SUMMARY OF THE INVENTION

Therefore, it is an object of the present invention to provide a junction field-effect transistor (JFET) that utilizes a p-type substrate as a buried gate contact. A further object of the present invention is to provide a device which can be used in either power applications, or in small signal amplifier applications by taking advantage of the physical properties of silicon carbide and avoiding the problems noted in a number of the prior attempts and devices. The invention meets these objects by providing a junction field-effect transistor that comprises a bulk single crystal silicon carbide substrate having respective first and second surfaces opposite one another, the substrate having a single polytype and having a concentration of suitable dopant atoms so as to make the substrate a first conductivity type. A first epitaxial layer of silicon carbide is formed on the first surface of the substrate, and having a concentration of suitable dopant atoms that give the first epitaxial layer the first conductivity type. A second epitaxial layer of silicon carbide is formed on the first epitaxial layer, the second epitaxial layer having a concentration of suitable dopant atoms to give the second epitaxial layer a second conductivity type opposite from the first conductivity type. A higher conductivity region of silicon carbide is formed on the second epitaxial layer, the higher conductivity region having a concentration of suitable dopant atoms to give the higher conductivity region the second conductivity type, but with the higher conductivity region having a higher concentration of dopant atoms than the second epitaxial layer for making the higher conductivity region more conductive than the second epitaxial layer and to give a resulting lower ohmic contact resistance. A trench is formed through the higher conductivity region and the second epitaxial layer extending entirely through the higher conductivity region and partially into the second epitaxial layer toward the first surface of the substrate for defining a gate region in the second epitaxial layer between the trench and the first epitaxial layer. The trench divides the higher conductivity region and the second epitaxial layer into a first and a second region with the trench therebetween.

The foregoing and other objects, advantages and features of the invention, and the manner in which the same are accomplished, will become more readily apparent upon consideration of the following detailed description of the invention taken in conjunction with the accompanying drawings, which illustrate preferred and exemplary embodiments, and wherein:

DETAILED DESCRIPTION

Figure 1:
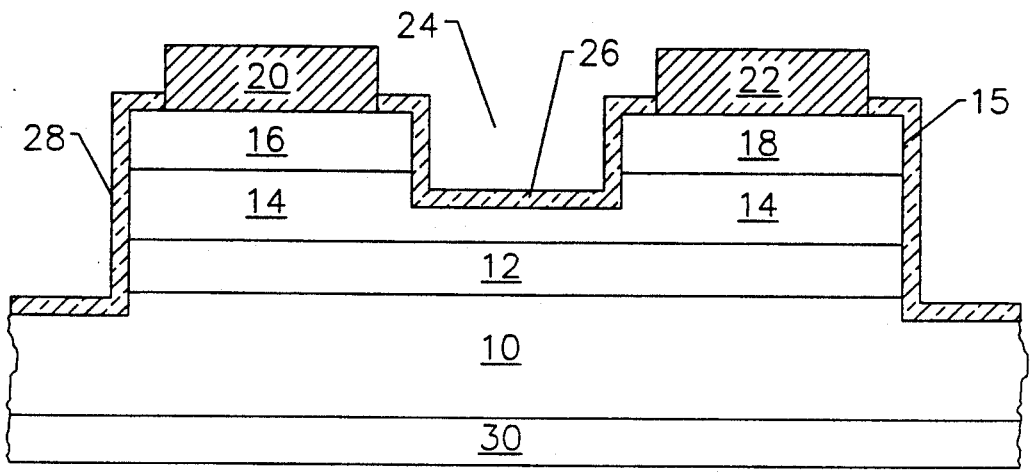
FIG. 1 is a cross-sectional view of a first embodiment of the present invention.

FIG. 1 illustrates a first embodiment of the present invention. A first epitaxial layer 2 is formed on the substrate 10 The substrate 10 is preferably formed of p-type conductivity bulk single crystal SiC of the 6H polytype. The substrate is preferably doped with aluminum (Al) to a carrier concentration of about $3 \times 10^{15}$ cm$^{-3}$ and preferably $1 \times 10^{17}$ cm$^{-3}$ or higher, however other suitable dopants to achieve the appropriate carrier concentrations may be used. The optional first epitaxial layer 12 is preferably formed of p-type SiC of the 6H polytype. The optional first epitaxial layer is preferably doped with Al to a minimum carrier concentration of about $1 \times 10^{17}$ cm$^{-3}$ and preferably to about $1 \times 10^{18}$ cm$^{-3}$ or higher, however other suitable dopants to achieve the appropriate carrier concentrations may be used. The epitaxial layers may be formed on the Si (0001) or the C (0001) face of the SiC substrate.

Onto the first epitaxial layer 12, or onto the substrate if the first epitaxial layer is not utilized, a second epitaxial layer 14 is formed. The second epitaxial layer 14 is preferably formed of n-type SiC of the 6H polytype. The second epitaxial layer is preferably doped with nitrogen (N) to a carrier concentration of between about $1 \times 10^{16}$ and $2.0 \times 10^{18}$ cm$^{-3}$, however other suitable dopants in appropriate concentrations may be used to achieve the above carrier concentrations. Onto the second epitaxial layer a higher conductivity region 15 is formed. The higher conductivity region 15 is preferably formed of n+type conductivity SiC of the 6H polytype. As used herein "n+" and "p+" refer to regions that are defined by higher carrier concentrations of dopant atoms than are present in adjacent or other regions of the same or another epitaxial layer or substrate. The higher conductivity region is preferably doped with N to achieve a carrier concentration of greater than about $5 \times 10^{17}$ cm$^{-3}$ and preferably $2 \times 10^{18}$ cm$^{-3}$ or higher, however other dopant atoms may be used in suitable concentrations to achieve the above described carrier concentrations.

A trench 24 formed through the higher conductivity region 15 and into the second epitaxial layer 14 divides the higher conductivity region 15 into a source region 16 and a drain region 18. The trench 24 defines the gate length of the device and may be formed using reactive ion etching or other techniques known to one skilled in the art. The trench is formed through the n higher conductivity region 15 and into the n-channel second epitaxial layer 14. The depth of the trench 24 into the second epitaxial layer 14 defines the cross-sectional height of the channel region and is selected based on the desired pinch-off voltage of the device given the carrier concentrations of the second epitaxial layer. Cross-sectional heights of from about 55 to about 1670 nanometers (nm) are desirable. The length of the trench 24 parallel to the flow of current beneath the trench determines the gate length of the device and is preferably made as small as possible. The trench should have a length selected to maximize the electric field beneath said channel and thereby minimize the affect of low electron mobility of silicon carbide. By reducing the size of the gate length, the intensity of the electric field beneath the gate is increased and thereby minimizes the effect of the low electron mobility of silicon carbide. Gate lengths of from about 0.1 to about 20 microns are preferred and are selected based on the intended application of the device. The width of the trench perpendicular to the flow of current beneath the trench defines the gate width. The gate should be as wide as possible for power devices, however, the gate width should not be so wide as to cause a substantial amount of power to be reflected back into the transistor because of impedance mismatches at the output of the transistor. For operating ranges of up to about 10 GHz, gate widths of about 500 mm to about 16 mm are preferred.

A source ohmic contact 20 and a drain ohmic contact 22 are formed on the source region 16 and the drain region 18 respectively. A gate ohmic contact 30 is formed on the exposed surface of the substrate 10. The source, drain and gate contacts may optionally be formed of annealed nickel or other suitable ohmic contact materials. The gate contact can be formed with annealed aluminum or aluminum based alloys or annealed Ni, Ti, W or other suitable p-type ohmic contacts. The source and drain can optionally have a conductive overlayer of a highly conductive metal such as aluminum, silver, platinum, gold, copper or others. After the formation of the trench, a passivating layer 24 may optionally be formed on said higher conductivity region 15 to passivate the surface between the source and drain ohmic contacts. The passivating layer is preferably silicon dioxide (SiO$_2$), however other materials may be used.

Optionally, the epitaxial layers of the structure described above may be formed into a mesa 28 which defines the periphery of the device, the sidewall of which extends at least to the first epitaxial layer and preferably to the substrate, as shown in FIG. 1, thereby confining the current to the mesa. The mesa 28 may be formed by reactive ion etching or other suitable techniques known to one skilled in the art.

As described above, the polytype of the substrate and of the epitaxial layers affects the operating characteristics of the transistor. Although a 6H SiC epitaxial layer on a 6H SiC substrate is the most preferred embodiment of the present invention, substrates and epitaxial layers in the following combinations may optionally be used: epitaxial layers of 15R SiC formed on substrates selected from the group consisting of 15R, 4H, 6H or 3C SiC, epitaxial layers of 6H SiC on substrates selected from the group consisting of 4H, 6H, 15R or 3C SiC, epitaxial layers of 4H SiC on substrates selected from the group consisting of 4H, 6H, 15R or 3C SiC, and epitaxial layers of 3C SiC on a substrate selected from the group consisting of 4H, 15R or 3C SiC substrate. The present invention also encompasses a transistor where the epitaxial layers have the same polytype as the single crystal substrate.

Devices fabricated using the above structure have shown higher transconductances than previously reported JFETs, and in particular, transconductances in the range of from about 17 to about 25 mS/mm may be obtained. The use of the higher conductivity region 15 greatly reduces the transconductance of the present transistor. The higher conductivity region 15 formed of n+conductivity SiC, optionally formed through epitaxial growth or by nitrogen (N+) ion implantation, reduces the ohmic contact resistance of the source and drain contacts. For a transistor without the n+ layer, the contact resistance to the channel layer ranges from about 4 to about $7 \times 10^{-4}$ $\Omega$-cm$^2$ for annealed Ni contacts. For a transistor having the n. layer, the contact resistance decreases dramatically to approximately $1 \times 10^{-5}$ $\Omega$-cm$^2$. Accordingly, a minimum carrier concentration of about $5 \times 10^{17}$ cm$^{-3}$ is suitable and carrier concentrations of $2 \times 10^{18}$ or higher are preferred to create the higher conductivity source and drain regions 16 and 18 and lower the resistance of the ohmic contacts. The higher conductivity region of n+conductivity SiC has been illustrated as an etched epitaxial layer. The formation of the source region 16 and the drain region 18, however, may be achieved through other techniques including, but not limited to, ion implantation or diffusion followed by the creation of a trench to divide the implanted or diffused region into source and drain regions.

In the above described transistor, the substrate and optional first epitaxial layer are a first conductivity type and the second epitaxial layer and region of higher conductivity are a second conductivity type. As described above the first conductivity type is p-type conductivity and the second conductivity type is n-type conductivity. However, the above described device could be fabricated with the first conductivity type being n-type conductivity and the second conductivity type being p-type conductivity, as described below.

The above described transistor may also be produced as a p-channel device where the substrate for the device is formed of n-type conductivity SiC, the first optional epitaxial layer is formed of n-type conductivity SiC, the second epitaxial layer is formed of p-type conductivity SiC and the higher conductivity region is formed of p+-type conductivity SiC. The p-channel device may optionally be manufactured using a substrate of 6H, 4H, 15R or 3C SiC polytypes combined with epitaxial layers of 6H, 4H, 15R or 3C SiC and permutations thereof. In the p-channel device, the substrate is preferably doped with N to a carrier concentration of greater than about $3 \times 10^{14}$ cm$^{-3}$ and preferably to a concentration of about $1 \times 10^{17}$ cm$^{-3}$ or higher. The first epitaxial layer is preferably doped with N to a carrier concentration of greater than about $1 \times 10^{17}$ cm$^{-3}$ and preferably to a concentration of about $1 \times 10^{18}$ cm$^{-3}$ or higher. The second epitaxial layer is preferably doped with Al to a carrier concentration between about $1 \times 10^{16}$ cm$^{-3}$ and $2.0 \times 10^{18}$ cm$^{-3}$. The layer of higher conductivity is preferably doped with Al to a carrier concentration of greater than about $5 \times 10^{17}$ cm$^{-3}$ and preferably to a concentration of about $2 \times 10^{18}$ cm$^{-3}$ or higher. The ohmic contact metals suitable to the appropriate conductivity type of the contact layer as described above may be utilized.

Figure 2:
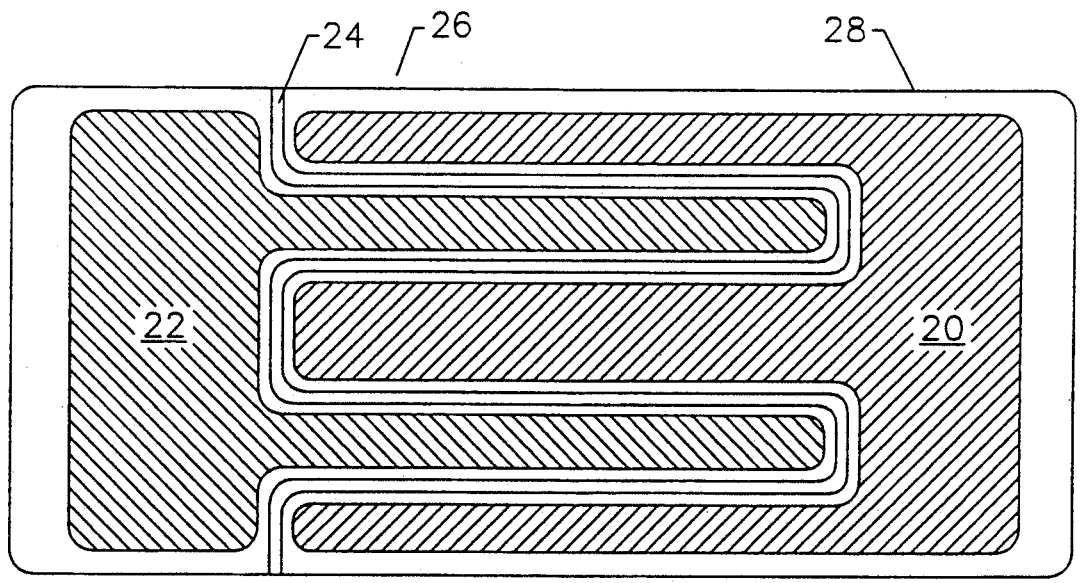
FIG 2 is an top plan view of a second embodiment of the present invention.

FIG. 2 is illustrative of a second embodiment of the present invention for small signal applications. The small signal device utilizes a relatively small die, with an interdigitated structure as shown in FIG. 2. The device illustrated in FIG. 2 has the same cross-section as that shown in FIG. 1. The illustrated device has a number of source digits 20 and drain digits 22. The digits are created by the serpentine trench 24 which divides the mesa 28 into source and drain regions. The gate width of the device is defined by the total length of the trench's serpentine pattern. The trench formed in the second epitaxial layer and the higher conductivity region forms a serpentine pattern and thereby creates interdigitated regions of the second epitaxial layer and the higher conductivity region. Optionally, a passivating layer 26 may be used to further isolate the source from the drain. The gate length and cross-sectional area are as defined above and have the same limitations and characteristics as above. Preferably, the gate length ranges from about 2 $\mu$m to about 20 $\mu$m and the gate width is about 4 mm or less.

Figure 3:
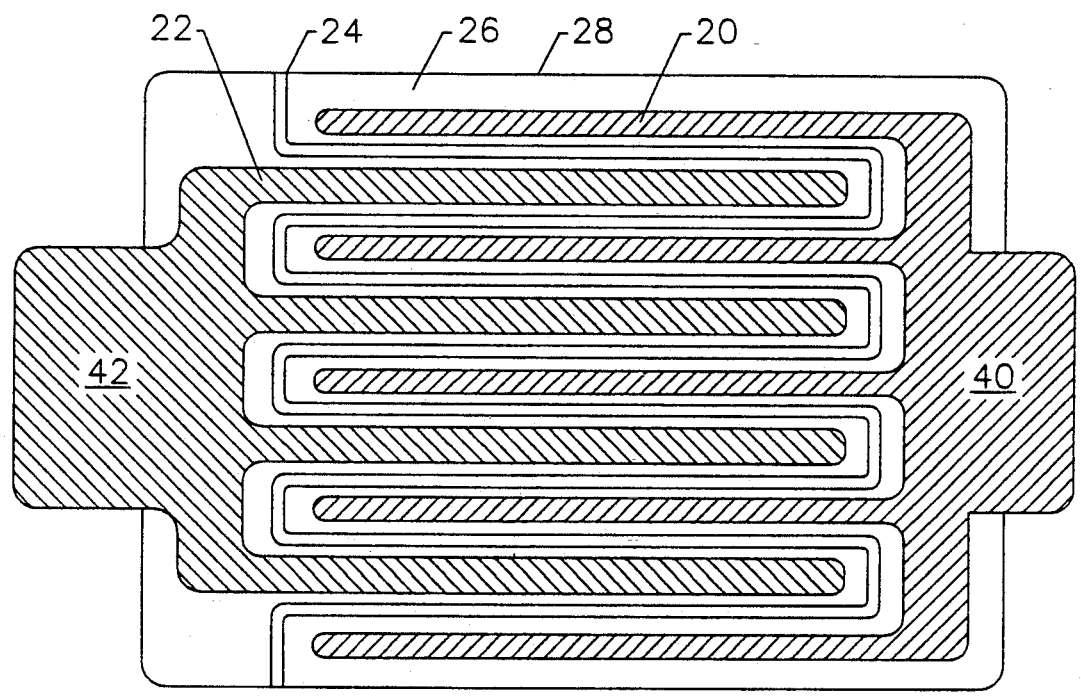
FIG. 3 is an top plan view of a third embodiment of the present invention.

FIG. 3 is illustrative of a third embodiment of the present invention for higher power applications. The device in FIG. 3 has the same cross-sectional structure as that shown in FIG. 1. The trench 24 formed downwardly through the third and second epitaxial layers forms a serpentine pattern to divide the layers alternating source digits 20 and drain digits 22 comprised of ohmic contacts formed on the higher conductivity region. The active gate area is confined by a mesa 28 and the bond pads 40 and 42 for the source and drain ohmic contacts are placed off of the mesa 28 on a deposited insulator (not shown) to keep the gate area, and thus the gate capacitance, as low as possible. The gate structure is as described above with a buried gate contact formed on the opposite surface of the substrate. The high power device preferably has a gate length of less than about 3 $\mu$m and a gate width from about 2 mm to about 264 mm or greater. Devices having power outputs of up to about 1000W or higher are possible utilizing the above described structure.

The invention and its advantages will be further understood through the following examples:

EXAMPLE I

Junction field-effect transistors were fabricated on 25.4 mm diameter wafers that were cut from 6H-SiC boules. These substrates were intentionally doped p-type during growth with aluminum (Al). These wafers were then diamond polished on the (0001) Si face. The epitaxial layers were intentionally doped with N or Al as the n-type and p-type dopants. The carrier concentrations of the substrates and epilayers were measured by the C-V technique using a double column mercury (Hg) probe.

The direct-current I-V characterization of the SiC transistors was performed using a Hewlett-Packard 4142B modular DC source/monitor and a standard probe station assembly. The high temperature measurements were made by placing the wafers on a boron nitride block containing two cartridge resistance heaters, which were monitored and controlled by a thermocouple feedback controller. The thermocouple was embedded in the block near the measurement surface. These measurements were made in air using palladium alloy probe tips to prevent oxidation.

The cross-sectional design of the JFET devices utilized Al-doped p-type substrates having a carrier concentration of $p = 5 \times 10^{16}$ cm$^{-3}$ as the gate. A p$^+$ epitaxial layer was grown on the substrate with a thickness of 2 microns ($\mu$m) and a doping to achieve a carrier concentration of $p = 1.4 \times 10^{18}$ cm$^{-3}$. The n-type conducting channel layers were grown 0.32 $\mu$m thick and doped to achieve a carrier concentration of $n = 2.1 \times 10^{17}$ cm$^{-3}$. A thin (0.2 $\mu$m) n$^+$ epilayer was then grown on top with a carrier concentration of $n = 4.5 \times 10^{18}$ cm$^{-3}$. Using reactive ion etching in NF$_3$, a mesa was etched down to the buried p-type layer to confine the current. A fine line trench (1 mm $\times$ 2 $\mu$m) was then etched across the mesa that cut through the top n$^{30}$ layer and down to the desired depth in the n-type conducting channel, thus defining the actual length of 2 $\mu$m. The wafer was thermally oxidized to passivate the surface. Nickel source and drain contacts were deposited and patterned on either side of the trench, and the gate contact metal, an aluminum alloy, was deposited on the backside of the wafers to form the gate contact. Finally, the ohmic contacts were annealed at high temperature.

Figure 4:
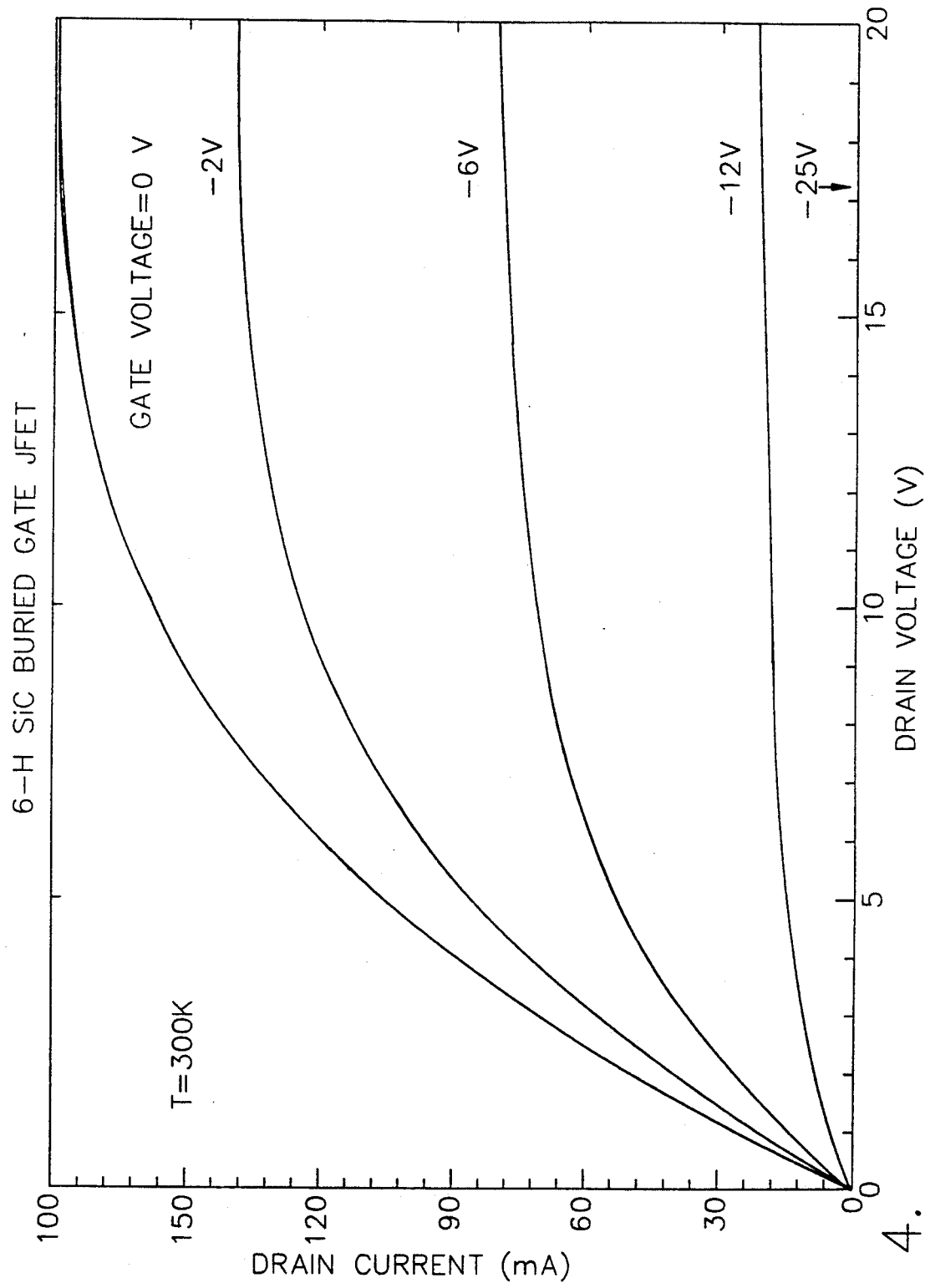
FIG. 4 is a drain current versus voltage plot for a transistor constructed according to the present invention.

The etched depth of the trench, which defined the thickness of the channel above the buried gate, dictated the pinch off voltage ($V_{po}$) and the drain current ($I_{DSS}$) of these devices. The short gate lengths (2 $\mu$m) and the n$^+$ source and drain layers resulted in devices with higher transconductances and capable of handling higher powers than typical SiC JFETs. The characteristic curve shown in FIG. 4 is for a 6H SiC JFET with an $I_{DSS}$ of 176 mA and a maximum transconductance ($g_{max}$) of 20 mS/mm at room temperature. This device had a pinch off voltage of $-22$ V and the drain leakage current at $V_D = 20$V and $V_G = -25$V was 1.0 $\mu$A.

EXAMPLE II

Figure 5A:
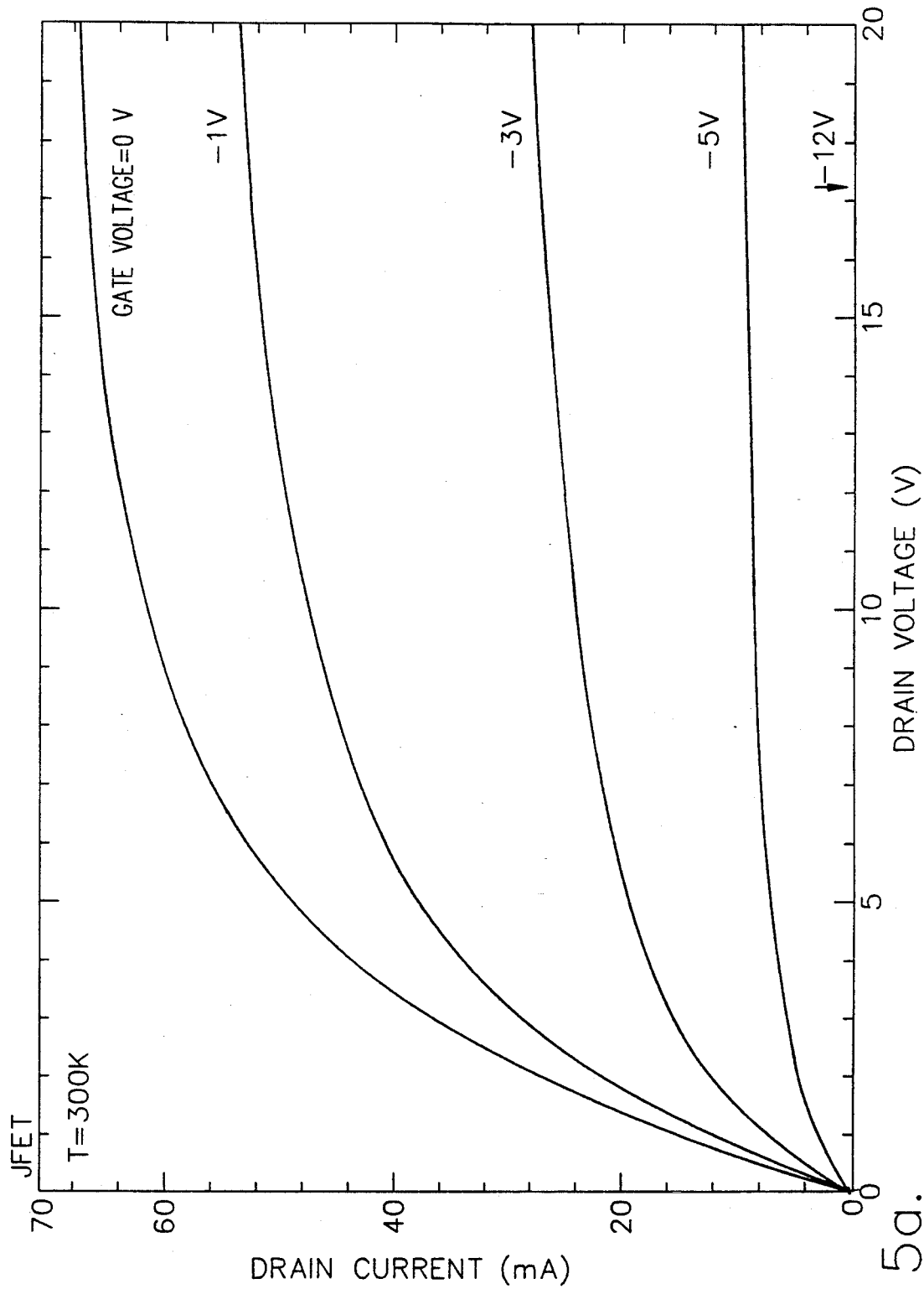
FIG. 5 is a series of drain current versus voltage plots at a) 300K b) 473K and c) 623K for a transistor according to the present invention.
Figure 5B:
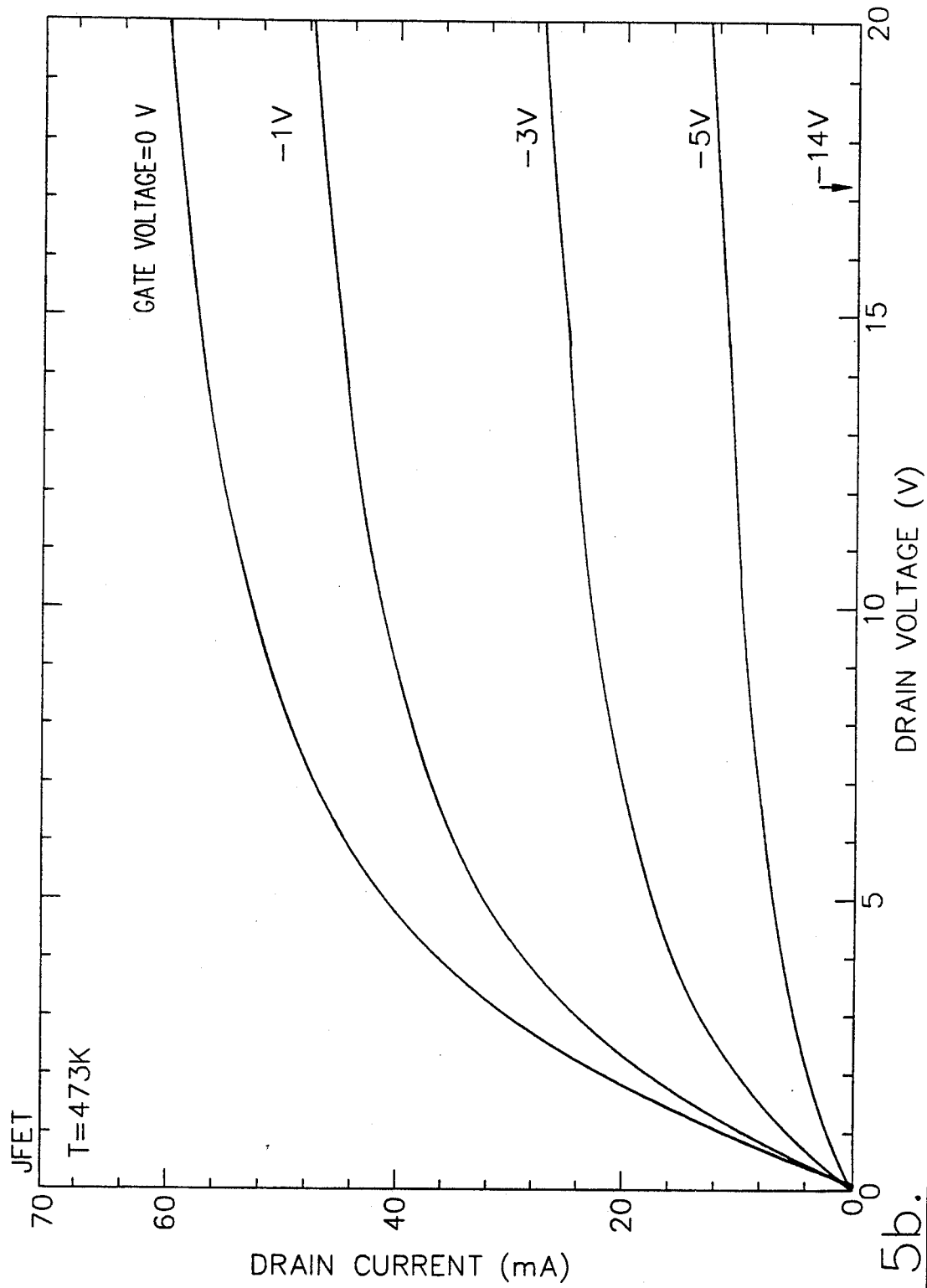
Figure 5C:
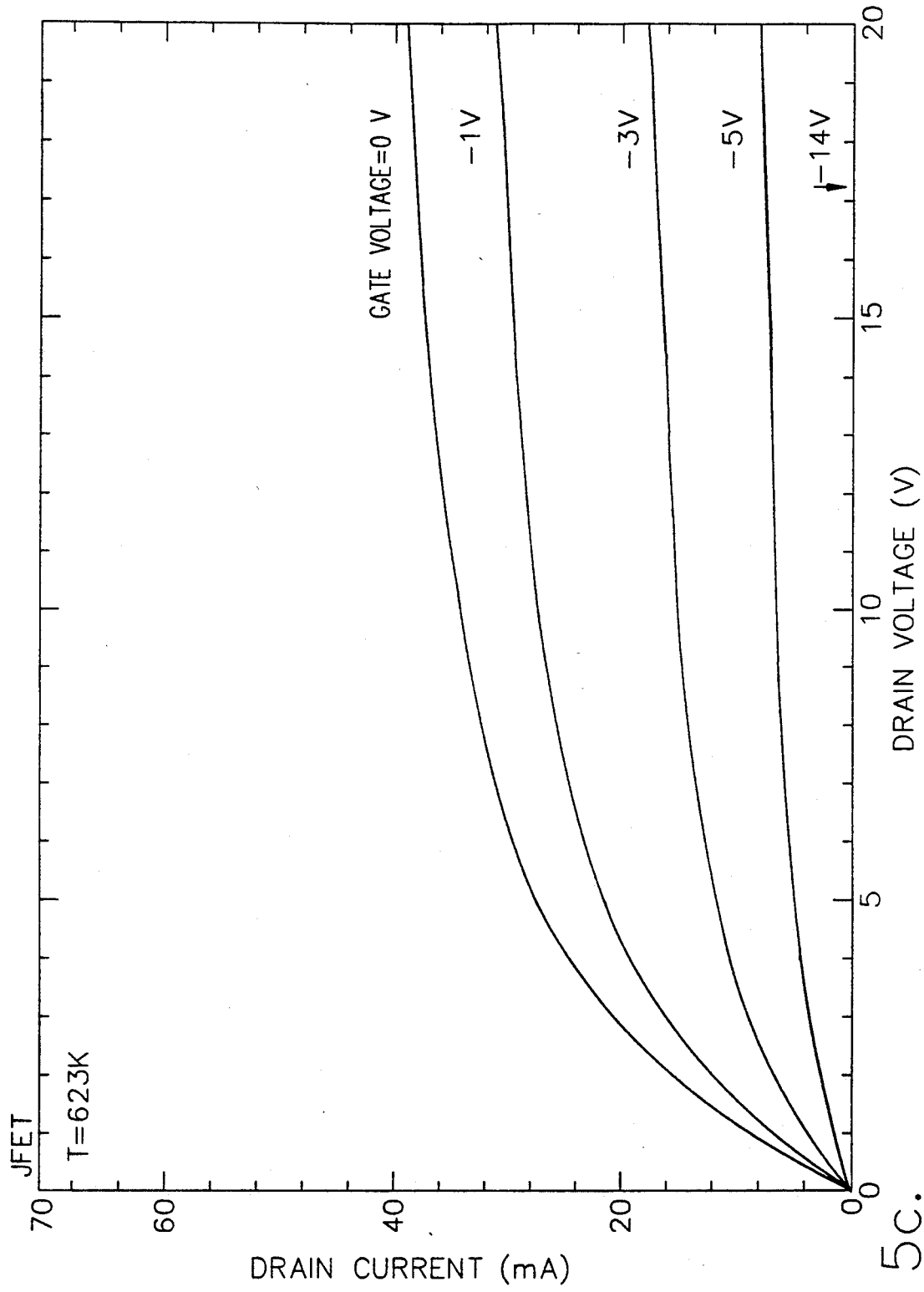

The I-V characteristics shown in FIG. 5(a) are for a buried-gate 6H-SiC JFET with a lower $V_{po}$ of $-10.5$V at room temperature. The lower gate biases required by this device resulted in a much lower drain leakage current of 14 nA at $V_D = 20$V and $V_G = -12$V. The measured gate leakage current at $V_D = 20$V and $V_G = -12$V was 15 $\mu$A. This device had a room temperature $I_{DSS}$ and $g_{max}$ of 68 mA and 16.4 mS/mm, respectively. When heated to 473K, these values decreased to 60.5 mA and 11.7 mS/mm, respectively as shown in FIG. 5(b) The drain leakage current and gate leakage current both increased to 80 nA and 28 $\mu$A, respectively, at $V_D = 20$ V and $V_G = -14$V. The $V_{po}$ remained stable at $-10.5$V. A further decrease in output characteristics was observed at 623K, as shown in FIG. 5(c). The $I_{DSS}$ decreased to 39 mA and the $g_{max}$ fell to 9.3 mS/mm. The drain leakage current and gate leakage current increased to 385 nA and 150 $\mu$A. The pinchoff voltage at 623 K decreased slightly to $V_G = -10.2$V. These general trends continued as the measurement temperature was increased to 773K, the highest temperature measured for these devices.

In the drawings and specification, there have been disclosed typical preferred embodiments of the invention and, although specific terms have been employed, they have been used in a generic and descriptive sense only and not for purposes of limitation, the scope of the invention being set forth in the following claims.

That which is claimed is:

1. A junction field-effect transistor formed in silicon carbide comprising:

a bulk single crystal silicon carbide substrate having respective first and second surfaces opposite one another, said substrate having a single polytype and having a concentration of suitable dopant atoms for making said substrate a first conductivity type;

an epitaxial layer of silicon carbide on said first surface of said substrate, said epitaxial layer having a concentration of suitable dopant atoms for making said epitaxial layer a second conductivity type opposite said first conductivity type;

a higher conductivity region of silicon carbide of said second conductivity type on said epitaxial layer, said higher conductivity region having a greater concentration of said dopant atoms than said epitaxial layer for making said higher conductivity region more conductive than said epitaxial layer;

a trench formed in said epitaxial layer and in said higher conductivity region and extending entirely through said higher conductivity region and partially into said epitaxial layer toward said first surface of said substrate for defining a gate region in said epitaxial layer between said trench and said substrate, said trench dividing said epitaxial layer and said higher conductivity region into respective first and second regions with said trench therebetween; and a metal gate contact on said second surface of said substrate for forming an active channel layer in said epitaxial layer between said first region and said second region when a bias is applied to said metal gate contact.

2. A junction field effect transistor according to claim 1 and further comprising:

ohmic contacts on said higher conductivity region for respectively defining one of aid first and second regions as the source region and the other of said ohmic contacts defining the other of said first and second regions as the drain region.

3. A junction field-effect transistor according to claim 1 wherein said epitaxial layers have the same polytype as said single crystal substrate.

4. A junction field-effect transistor according to claim 1 wherein said first conductivity type is p-type conductivity and said second conductivity type is n-type conductivity.

5. A junction field-effect transistor according to claim 1 where said first conductivity type is n-type conductivity and said second conductivity type is p-type conductivity.

6. A junction field-effect transistor according to claim 1 where said epitaxial layer and said higher conductivity region comprise a mesa for defining the periphery of said transistor and for confining the flow of current to said epitaxial layer and said higher conductivity region.

7. A junction field-effect transistor formed in silicon carbide comprising:

a bulk single crystal silicon carbide substrate having respective first and second surfaces opposite one another, said substrate having a single polytype and having a concentration of suitable dopant atoms for making said substrate a first conductivity type;

a first epitaxial layer of silicon carbide on said first surface of said substrate, said first epitaxial layer having a concentration of suitable dopant atoms for making said first epitaxial layer a first conductivity type;

a second epitaxial layer of silicon carbide on said first surface of said substrate, said second epitaxial layer having a concentration of suitable a dopant atoms for making said second epitaxial layer a second conductivity type opposite said first conductivity type;

a higher conductivity region of silicon carbide formed on said second epitaxial layer, said higher conductivity region having a concentration of suitable dopant atoms for making said higher conductivity region said second conductivity type, said higher conductivity region having a greater concentration of said dopant atoms than said second epitaxial layer for making said higher conductivity region more conductive than said second epitaxial layer; and a trench formed in said second epitaxial layer and said higher conductivity region extending entirely through said higher conductivity region and partially into said second epitaxial layer, toward said first surface of said substrate for defining a gate region in said second epitaxial layer between said trench and said substrate, said trench dividing said second epitaxial layer and said higher conductivity region into respective first and second regions with said trench therebetween; and a metal gate contact on said second surface of said substrate for forming an active channel layer in said second epitaxial layer between said first region and said second region when a bias is applied to said metal gate contact.

8. A junction field effect transistor according to claim 7 and further comprising:

ohmic contacts on said higher conductivity region for respectively defining one of said first and second regions as the source region and the other of said ohmic contacts defining the other of said first and second regions as the drain region.

9. A junction field-effect transistor according to claim 7 where said substrate is of a polytype selected from the group consisting of: 6H, 15R, 4H and 3C and said epitaxial layers are 15R SiC.

10. A junction field-effect transistor according to claim 7 where said substrate is of a polytype selected from the group consisting of: 6H, 4H, 15R and 3C and said epitaxial layers are 4H SiC.

11. A junction field-effect transistor according to claim 7 where said substrate is of a polytype selected from the group consisting of: 4H, 15R, and 3C and said epitaxial layers are 3C SiC.

12. A junction field-effect transistor according to claim 7 where said substrate is of a polytype selected from the group consisting of: 4H, 15R, 6H and 3C and said epitaxial layers are 6H SiC.

13. A junction field-effect transistor according to claim 7 wherein said epitaxial layers have the same polytype as said single crystal substrate.

14. A junction field-effect transistor according to claim 7 wherein said first conductivity type is p-type conductivity and said second conductivity type is n-type conductivity.

15. A junction field-effect transistor according to claim 7 where said first conductivity type is n-type conductivity and said second conductivity type is p-type conductivity.

16. A junction field-effect transistor according to claim 7 where said second epitaxial layer and said higher conductivity region form a mesa and thereby defining the periphery of said transistor and confining the flow of current to said epitaxial layer and higher conductivity region.

17. A junction field-effect transistor according to claim 7 where said substrate has a carrier concentration of dopant atoms greater than about $3 \times 10^{15}$ cm$^{-3}$.

18. A junction field-effect transistor according to claim 7 where said first epitaxial layer has a carrier concentration of dopant atoms greater than about $1 \times 10^{17}$ cm$^{-3}$.

19. A junction field-effect transistor according to claim 7 where said second epitaxial layer has a carrier concentration of dopant atoms of between about $1 \times 10^{16}$ and $2 \times 10^{18}$ cm$^{-3}$.

20. A junction field-effect transistor according to claim 7 wherein the length of said trench is minimized to maximize the electric field beneath said channel and thereby minimize the effect of low electron mobility of silicon carbide.

21. A junction field-effect transistor according to claim 7 having an operating range of up to 10 GHz.

22. A junction field-effect transistor according to claim 7 wherein said trench formed in said second epitaxial layer and said higher conductivity region forms a serpentine pattern of interdigitated regions of said second epitaxial layer and higher conductivity region.

23. A transistor according to claim 16 further comprising a passivating layer on the sidewalls of said mesa and said trench.

24. A junction field-effect transistor formed in silicon carbide comprising:

a bulk single crystal silicon carbide substrate having respective first and second surfaces opposite one another, said substrate having a single polytype and having a concentration of suitable dopant atoms for making said substrate a first conductivity type;

a first epitaxial layer of silicon carbide formed on said first surface of said substrate, said first epitaxial layer having a concentration of suitable dopant atoms so as to make said first epitaxial layer said first conductivity type;

a second epitaxial layer of silicon carbide formed on said first epitaxial layer, said second epitaxial layer having a concentration of suitable dopant atoms for making said second epitaxial layer a second conductivity type opposite said first conductivity type;

a higher conductivity region of said second polytype silicon carbide formed on said second epitaxial layer, said higher conductivity region having a concentration of suitable dopant atoms for making said higher conductivity region said second conductivity type, said higher conductivity region having a conductivity greater than said second epitaxial layer;

a trench formed in said higher conductivity region and said second epitaxial layer, said trench forming a serpentine pattern in said second epitaxial layer and higher conductivity region and extending entirely through said higher conductivity region and partially into said second epitaxial layer towards said first surface of said substrate for defining a gate region in said second epitaxial layer between said trench and said first epitaxial layer, said trench dividing said second epitaxial layer and higher conductivity region into a first region and a second region;

ohmic contacts formed on said higher conductivity region, said ohmic contacts being interdigitated between said serpentine pattern of said trench, one of said ohmic contacts having a plurality of digits and defining said first region as the source region and the other of said ohmic contacts having a plurality of digits and defining said second region as the drain region with said serpentine trench separating said digits of said source region from said digits of said drain region;

a metal gate contact formed on said second surface of said substrate for forming an active channel in said second epitaxial layer between said source region and said drain region when a bias is applied to said metal gate contact.

25. A junction field-effect transistor according to claim 24 wherein said substrate and said epitaxial layers have a polytype selected from the group consisting of: 6H, 15R, 4H and 3C.

26. A junction field-effect transistor according to claim 25 wherein said substrate and epitaxial layers are the same polytype.

27. A junction field-effect transistor according to claim 24 where said first conductivity type is p-type conductivity and said second conductivity type is n-type conductivity.

28. A junction field-effect transistor according to claim 24 where said first conductivity type is n-type conductivity and said second conductivity type is p-type conductivity.

29. A junction field-effect transistor according to claim 24 wherein said second epitaxial layer and said higher conductivity region form a mesa for defining the periphery of said transistor and confining the flow of current to said second epitaxial layer and higher conductivity region.

30. A junction field-effect transistor according to claim 29 further comprising an insulative layer formed on said first surface of said substrate and extending outward from said mesa, said source and drain ohmic contacts extending beyond said mesa on said insulative layer thereby minimizing the gate capacitance of said transistor.

* * * * *

UNITED STATES PATENT AND TRADEMARK OFFICE
CERTIFICATE OF CORRECTION

PATENT NO. : 5,264,713  
DATED : November 23, 1993  
INVENTOR(S) : Palmour

It is certified that error appears in the above-identified patent and that said Letters Patent is hereby corrected as shown below:

Title page, item [56],
UNDER "OTHER PUBLICATIONS":

Column 1, line 2, "Crystalling" should be -- Crystalline --.

Column 1, line 8, "Jun." should be -- June 6, 1991 --.

Title page, item [57],
IN THE ABSTRACT:

Column 2, line 16, after "layer", the comma (,) should be a period (.).

Column 3, line 34, after "300K" insert a comma (,).

Column 3, line 39, "2" should be -- 12 --.

Column 3, lines 44, 51 and 61, after "however" insert a comma (,).

Column 3, line 50, "10 $^{17}$" should be -- $10^{17}$ --.

Column 4, lines 6 and 61, after "however" insert a comma (,).

Column 4, line 15, "n" should be -- $n^+$ --.

Column 4, line 28, "affect" should be -- effect --.

Column 5, line 33, "n" should be -- $n^+$ --.

UNITED STATES PATENT AND TRADEMARK OFFICE
CERTIFICATE OF CORRECTION

PATENT NO. : 5,264,713

DATED : November 23, 1993

INVENTOR(S) : Palmour

It is certified that error appears in the above-identified patent and that said Letters Patent is hereby corrected as shown below:

Column 7, line 27, "$n^{30}$" should be -- $n^+$ --.

Column 7, lines 38 and 46, "pinch off" should be -- pinch-off --.

Column 7, line 59, after "respectively" insert a comma (,).

Column 7, line 60, after "5(b)" insert a period (.).

Column 7, line 68, "pinchoff" should be -- pinch-off --.

Column 7, line 68, "623 K" should be -- 623K --.

Column 8, line 47, "aid" should be -- said --.

Column 8, lines 59 and 63, "where" should be -- wherein --.

Column 9, line 13, omit "a" (second occurrence).

Column 9, lines 51, 55, 59 and 63, "where" should be -- wherein --.

Column 10, lines 6, 10, 16, 19, and 23, "where" should be -- wherein --.

UNITED STATES PATENT AND TRADEMARK OFFICE
CERTIFICATE OF CORRECTION

PATENT NO. : 5,264,713
DATED : November 23, 1993
INVENTOR(S) : Palmour

It is certified that error appears in the above-indentified patent and that said Letters Patent is hereby corrected as shown below:

Column 12, lines 7 and 11, "where" should be -- wherein --.

Signed and Sealed this

Seventh Day of June, 1994

Attest:

BRUCE LEHMAN

Attesting Officer

Commissioner of Patents and Trademarks